(12) United States Patent
Kashiwaya (10) Patent No.: US 11,169,186 B2
(45) Date of Patent: Nov. 9, 2021

(54) HEAT-RESISTANCE ELEMENT FOR CURRENT DETECTION

(71) Applicant: NGK INSULATORS, LTD., Nagoya (JP)

(72) Inventor: Toshikatsu Kashiwaya, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 237 days.

(21) Appl. No.: 16/424,702

(22) Filed: May 29, 2019

(65) Prior Publication Data

US 2019/0277893 A1 Sep. 12, 2019

Related U.S. Application Data

(63) Continuation of application No. PCT/JP2017/040322, filed on Nov. 8, 2017.

(30) Foreign Application Priority Data

Dec. 21, 2016 (JP) .............................. JP2016-248440

(51) Int. Cl.
*G01R 15/18* (2006.01)
*H01F 38/14* (2006.01)
(Continued)

(52) U.S. Cl.
CPC ............. *G01R 19/32* (2013.01); *G01R 15/18* (2013.01); *G01R 15/181* (2013.01); *H01F 38/14* (2013.01);
(Continued)

(58) Field of Classification Search
CPC ...... G01R 19/32; G01R 15/18; G01R 15/181; H01F 38/30; H01F 38/14; H01F 2038/143; H01F 5/003
See application file for complete search history.

(56) References Cited

U.S. PATENT DOCUMENTS 4,616,176 A * 10/1986 Mercure .............. G01R 15/181
324/127
5,414,400 A 5/1995 Gris et al.
(Continued)

FOREIGN PATENT DOCUMENTS

JP H06-176947 A1 6/1994
JP 11265974 A * 9/1999
(Continued)

OTHER PUBLICATIONS

J. D. Ramboz, "Machinable Rogowski coil, design, and calibration," in IEEE Transactions on Instrumentation and Measurement, vol. 45, No. 2, pp. 511-515, Apr. 1996 (Year: 1996).*
(Continued)

*Primary Examiner* — Daniel R Miller
(74) *Attorney, Agent, or Firm* — Burr & Brown, PLLC (57) ABSTRACT

A heat-resistance element includes: a heat-resistant substrate including a ceramic material; one or more power wires embedded in the heat-resistant substrate; and a coil structure that is configured by a coil wire extending between start and end points and includes coil segments. The coil segment includes or corresponds to one winding of the coil wire. The coil segment includes: a first conductor extending along the power wire; a second conductor arranged farther from the one or more power wires than the first conductor, the second conductor extending along the power wire; a first connection wire coupling the first and second conductors in the same coil segment; and a second connection wire coupling first and second conductors of adjacent coil segments in the circumferential direction, all of which are embedded in the heat-resistant substrate, and at least the first conductor and the second conductor are not exposed from the heat-resistant substrate.

8 Claims, 10 Drawing Sheets

(51) Int. Cl.
*H01F 38/30* (2006.01)
*G01R 19/32* (2006.01)

(52) U.S. Cl.
CPC ....... *H01F 38/30* (2013.01); *H01F 2038/143* (2013.01)

(56) References Cited

U.S. PATENT DOCUMENTS

| | | | |
|---|---|---|---|
| 6,081,429 A * | 6/2000 | Barrett | G01R 1/0416 257/686 |
| 6,211,065 B1 * | 4/2001 | Xi | B05D 1/62 204/192.17 |
| 6,313,623 B1 | 11/2001 | Kojovic et al. | |
| 8,222,103 B1 * | 7/2012 | Baars | H01L 27/10817 438/239 |
| 2003/0015720 A1 * | 1/2003 | Lian | H01L 27/0605 257/98 |
| 2003/0216035 A1 * | 11/2003 | Rengarajan | C23C 14/5873 438/637 |
| 2005/0212642 A1 | 9/2005 | Pleskach et al. | |
| 2006/0119496 A1 * | 6/2006 | Tester | G05F 3/262 341/144 |
| 2007/0152651 A1 * | 7/2007 | Shiokawa | G01R 15/181 324/76.11 |
| 2009/0051467 A1 * | 2/2009 | McKinzie, III | H01P 1/2005 333/219 |
| 2010/0242380 A1 * | 9/2010 | Waldow | F16F 15/067 52/167.4 |
| 2011/0204879 A1 * | 8/2011 | Peretto | G01R 15/14 324/127 |
| 2013/0303030 A1 * | 11/2013 | Garabieta Artiagoitia | H01R 13/6683 439/676 |
| 2014/0055973 A1 | 2/2014 | Hirai et al. | |
| 2015/0369845 A1 * | 12/2015 | Salles | G01R 31/2884 324/126 |
| 2016/0327592 A1 * | 11/2016 | Hewson | H01F 27/2885 |

FOREIGN PATENT DOCUMENTS

| | | |
|---|---|---|
| JP | 2000-068139 A1 | 3/2000 |
| JP | 2000-228323 A1 | 8/2000 |
| JP | 2003-050254 A1 | 2/2003 |
| JP | 2004-014925 A1 | 1/2004 |
| JP | 2007-057494 A1 | 3/2007 |
| JP | 2011-035414 A1 | 2/2011 |
| WO | 2012/157373 A1 | 11/2012 |

OTHER PUBLICATIONS

International Search Report and Written Opinion (Application No. PCT/JP2017/040322) dated Jan. 30, 2018.

English translation of International Preliminary Report on Patentability (Chapter I) (Application No. PCT/JP2017/040322) dated Jul. 4, 2019.

* cited by examiner

HEAT-RESISTANCE ELEMENT FOR CURRENT DETECTION

CROSS REFERENCE TO RELATED APPLICATION

The is a continuation of PCT International Application PCT/JP2017/040322 filed on Nov. 8, 2017, which claims a priority of Japanese Patent Application No. 2016-248440 filed on Dec. 21, 2016. The disclosures of these applications including the specifications, the drawings, and the claims are hereby incorporated by reference in its entirety.

FIELD OF THE INVENTION

The present disclosure is directed to a heat-resistance element for detecting a current.

BACKGROUND OF THE INVENTION

International Publication No. 2012/157373 discloses that an electrode is embedded in a ceramic substrate so as to promote heat dissipation, for example.

Japanese Patent Application Laid-open No. 2011-35414 discloses that a transformer is embedded in a ceramic substrate through firing.

Japanese Patent Application Laid-open No. 2000-228323 discloses a Rogowski coil configured by a winding using a printed board.

SUMMARY OF THE INVENTION

There is a need to increase the reliability of a system built up from plural electronic components even in a harsh environment such an engine room where a vehicle engine is disposed. As the electronic components, integrated circuits (IC), power transistors, capacitors, inductors and the like can be named. Feed-back control may be performed based on monitoring of a current flowing in such a system, thus increasing reliability of the system operation or allowing immediate detection of malfunction of the system operation.

In a case where a current sensor using a printed board is place in a harsh environment, the printed board may thermally expand and/or thermally deform, possibly lowering a current-sensing ability of the current sensor due to the geometric change of a wiring.

A heat-resistance element for detecting a current according to an aspect of the present disclosure may include:
a heat-resistant substrate including a ceramic material;
one or more power wires embedded in the heat-resistant substrate; and
a coil structure for detecting a current flowing in the one or more power wires, the coil structure being configured by a coil wire extending between start and end points, the coil structure comprising coil segments arranged between the start and end points of the coil wire in a circumferential direction around the one or more power wires, and the coil segment including or corresponding to one winding of the coil wire, wherein
the coil segment includes:
a first conductor extending along the power wire;
a second conductor arranged farther from the one or more power wires than the first conductor, the second conductor extending along the power wire;
a first connection wire coupling the first and second conductors in the same coil segment; and
a second connection wire coupling first and second conductors of adjacent coil segments in the circumferential direction, and wherein
the first conductor, the second conductor, the first connection wire, and the second connection wire are embedded in the heat-resistant substrate, and at least the first conductor and the second conductor are not exposed from the heat-resistant substrate.

In some exemplary embodiments, further provided is at least one external connection wire coupled to the first conductor, the second conductor, the first connection wire, or the second connection wire.

In some exemplary embodiments, the ceramic material includes alumina, silica, zirconia, titania, magnesia, or cordierite.

In some exemplary embodiments, the heat-resistant substrate includes a glass material.

In some exemplary embodiments, the power wire and the coil structure include the same metal material.

In some exemplary embodiments, the power wire and the coil structure include copper.

In some exemplary embodiments, a plurality of power wires is provided. Respective first conductors are arranged by the same distance away from a surrounding line around the plurality of power wires in a plane orthogonal to a direction the power wires extend.

In some exemplary embodiments, adjacent coil segments in the circumferential direction are coupled through at least one relay coil segment that is sized smaller than the coil segment, and the second connection wire of the coil segment couples the first or second conductor with the relay coil segment instead of coupling the first and second conductors of adjacent coil segments in the circumferential direction.

In some exemplary embodiments, the relay coil segment includes:
a third conductor extending along the power wire;
a fourth conductor arranged farther from the one or more power wires than the third conductor, the fourth conductor extending along the power wire;
a third connection wire coupling the third and fourth conductors; and
a fourth connection wire coupling the third or fourth conductor with the first or second conductor.

In some exemplary embodiments, the first to fourth conductors are arranged in the same plane.

In some exemplary embodiments, the heat-resistance element is further provided with a returning wire extending along the circumferential direction from the end point toward the start point of the coil wire of the coil structure, the returning wire passing through the coil segments.

According to an aspect of the present disclosure, there is provided a heat-resistance element for detecting a current with improved heat-resistance.

BRIEF DESCRIPTION OF THE DRAWINGS

FIG. 1 is a view mainly for a clear illustration of configurations of the power wires and the coil structure. The coil structure is embedded in the heat-resistant substrate.

FIG. 7 is a view mainly for a clear illustration of configurations of the power wires and the coil structure. The coil structure is embedded in the heat-resistant substrate.

DETAILED DESCRIPTION OF THE INVENTION

Hereinafter, non-limiting exemplary embodiments of the present invention will be described with reference to FIGS. 1 to 12. Disclosed one or more embodiments and respective features included in the embodiments are not mutually exclusive. A skilled person would be able to combine respective embodiments and/or respective features without requiring excess descriptions, and would appreciate synergistic effects of such combinations. Overlapping descriptions among the embodiments would be basically omitted. Referenced drawings are prepared for the purpose of illustration of invention, and may possibly be simplified for the sake of convenience of illustration.

Figure 1:
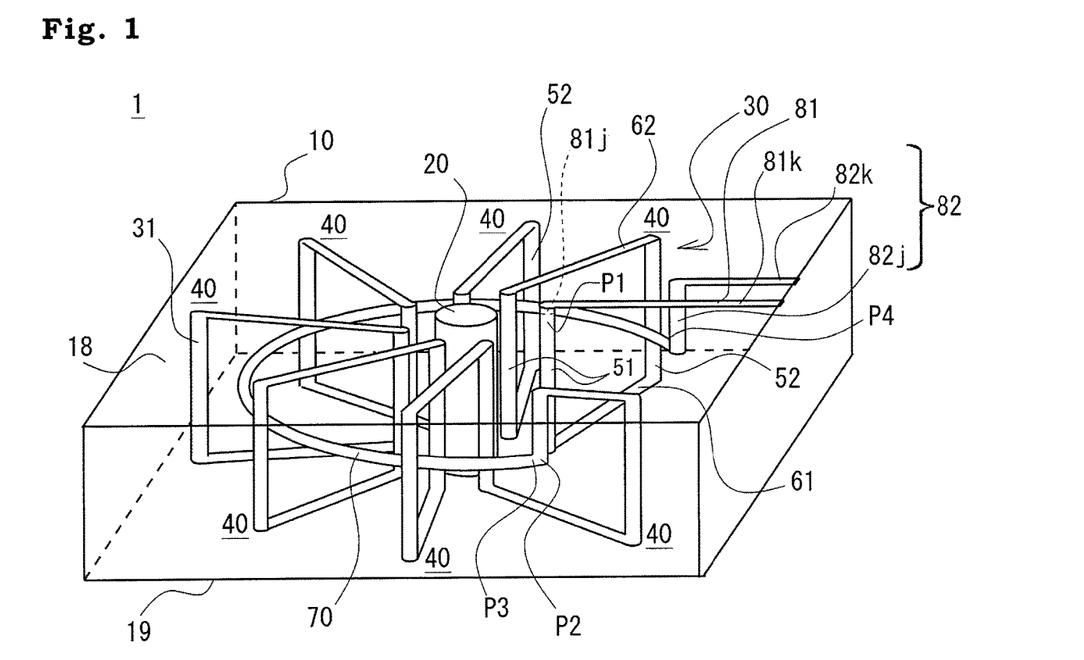
FIG. 1 is a schematic perspective view of a heat-resistance element according to an aspect of the present disclosure, illustrating power wires, coil structure and the like embedded in a heat-resistant substrate.
Figure 2:
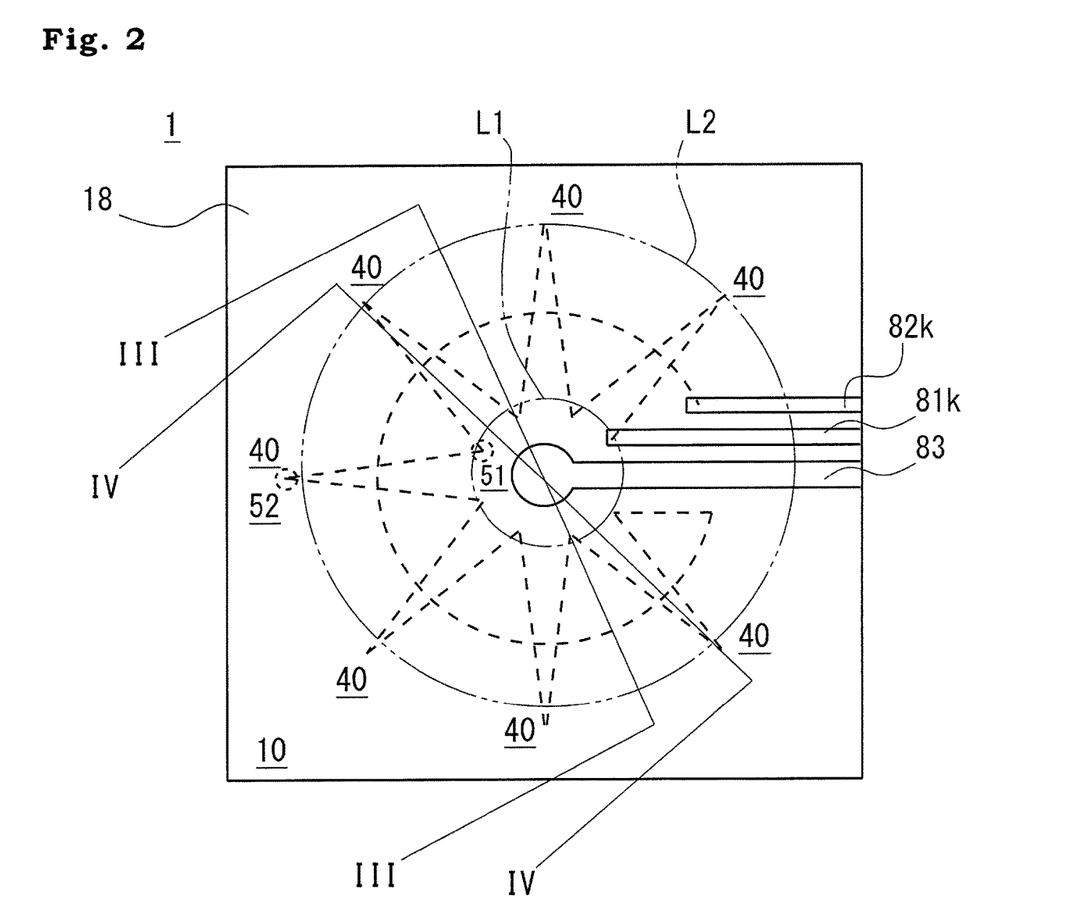
FIG. 2 is a schematic top view of the heat-resistance element shown in FIG. 1, wires embedded in the heat-resistant substrate being schematically illustrated as dotted lines. The respective ones of first conductors and respective ones of second conductors are schematically illustrated by dotted lines. Phantom line L1 indicates a smaller-diameter imaginary circle on which first conductors are arranged. Phantom line L2 indicates a larger-diameter imaginary circle on which second conductors are arranged.

FIG. 1 is a schematic perspective view of a heat-resistance element according to an aspect of the present disclosure, illustrating power wires, coil structure and the like embedded in a heat-resistant substrate. FIG. 1 is a view mainly for a clear illustration of configurations of the power wires and the coil structure. The coil structure is embedded in the heat-resistant substrate. FIG. 2 is a schematic top view of the heat-resistance element shown in FIG. 1, wires embedded in the heat-resistant substrate being schematically illustrated as dotted lines. The respective ones of first conductors and respective ones of second conductors are schematically illustrated by dotted lines. Phantom line L1 indicates a smaller-diameter imaginary circle on which first conductors are arranged. Phantom line L2 indicates a larger-diameter imaginary circle on which second conductors are arranged.

As shown in FIGS. 1 and 2, a heat-resistance element for detecting a current 1 has a heat-resistant substrate 10, one or more power wires 20 embedded in the heat-resistant substrate 10, and a coil structure 30 for detecting a current flowing in the one or more power wires 20. The coil structure 30 may be referred to as toroidal coil or Rogowski coil.

The heat-resistant substrate 10 is mainly made of a ceramic material, and therefore may be simply referred to as a ceramic substrate. The fact that the main component is a ceramic material indicates that mass % (weigh t%) of ceramic material is the highest among other materials. In a case where the heat-resistant substrate 10 includes a ceramic material, heat-resistance of the heat-resistant substrate 10 is enhanced, and large thermal expansion and/or thermal deformation is avoided or suppressed even disposed in a high-temperature environment.

In some cases, the ceramic material as the main component of the heat-resistant substrate 10 may be one or more material selected from a group consisting of alumina ($Al_2O_3$), silica ($SiO_2$), zirconia ($ZrO_2$), titania ($TiO_2$), magnesia (MgO), and cordierite ($2MgO-Al_2O_3-SiO_2$).

In addition to the ceramic material of the main component, the heat-resistant substrate 10 may include another material as a non-main component. In some cases including the present illustrated example, the heat-resistant substrate 10 includes a glass material as a non-main component in addition to the ceramic material of main component. The content of glass material may be equal to or greater than 31 wt %, preferably equal to or greater than 36 wt %, and further preferably equal to or greater than 41 wt %. The heat-resistant substrate 10 include a glass material that has a melting temperature lower than that of the ceramic material so that lowered firing temperature is facilitated as described below in connection with a method of producing a heat-resistance element 1. A heat-resistant substrate 10 made of a mixture of alumina ($Al_2O_3$) and a glass material is a type of material referred to as LTCC (Low Temperature Co-fired Ceramics). In a case where the heat-resistant substrate 10 is made of LTCC, use of copper or silver or alloy including copper or silver as the main component would be facilitated for the power wire 20 and/or the coil structure 30. LTCC may be fired in the temperature range of 900° C. to 1000° C. so that sufficient mechanical strength and heat-resistance of the heat-resistant substrate 10 is achieved. Furthermore, a portion of the power wire 20 and/or the coil structure 30 of the heat-resistant substrate 10 may have the same material as a copper wiring which may be included in an integrated circuit (IC), power transistor, capacitor, inductor or the like of electronics component, so that more reliable electronical connection between the electronic component and the heat-resistance element 1 may be facilitated even in a high-temperature environment. For example, one may select a solder with a tailored composition for the metal portions of the heat-resistance element 1 and the electronic component which are made of the same metal, copper.

The power wire 20 may be made of copper or silver, or may include copper or silver as the main component, or may include an alloy that includes copper or silver as the main component. The coil structure 30 may be made of copper or silver, or may include copper or silver as the main component, or may include an alloy that includes copper or silver as the main component. Depending to embodiments, the power wire 20 and the coil structure 30 include the same metal material, not necessarily limited to this through.

The power wire 20 is embedded in the heat-resistant substrate 10. FIGS. 1 and 2 disclose an example where one power wire 20 is provided, but envisioned is an exemplary variation where a plurality of power wires 20 is provided as would be appreciated from the following description. The power wire 20 of the illustrated example extends in the thickness direction of the heat-resistant substrate 10. The thickness of the heat-resistant substrate 10 is defined by first and second surfaces 18, 19 of the heat-resistant substrate 10. The power wire 20 is arranged so as to penetrate through the first surface 18 and the second surface 19 opposite to the first surface 18 of the heat-resistant substrate 10. However, in another example, the power wire 20 may be totally or partially embedded in the heat-resistant substrate 10. The power wire 20 is illustrated as a cylinder, but can take other various contours besides a circle in a cross-section orthogonal to its extending direction, such as polygon including triangle, rectangle, pentagon or the like or star-shape. An embodiment is envisioned where diameter or width of the power wire 20 changes along its extending direction.

Various connecting manners are envisioned between the external connection wire 83 and each end of the power wire 20 of the heat-resistant substrate 10. FIG. 2 shows an example where the external connection wire 83 formed in the first surface 18 of the heat-resistant substrate 10 is connected to a first end of the power wire 20. Similarly understood would be that an external connection wire 83 formed in the second surface 19 of the heat-resistant substrate 10 is connected to a second end of the power wire 20. A manner is envisioned that the external connection wire 83 is omitted and a terminal of another electronic component is connected via a bump to the first and/or second end of the power wire 20.

As described above, the power wire 20 may be made of copper or silver, or may include copper or silver as the main component, or may include an alloy that includes copper or silver as the main component. In some cases where a mixture of at least ceramic and glass materials is used for the heat-resistant substrate 10, copper or silver would be allowed to be used for the power wire 20.

The coil structure 30 is provided for detecting a current that flows in the one or more power wires 20. As well understood in this technical field, a current flowing in the one or more power wires 20 can be measured by connecting an integrating circuit, not shown, to the coil structure 30. Such method of detecting a current is well known in view of current technical level at the time of filling of this application, and thus descriptions thereof will be omitted.

As well understood from FIG. 1, the coil structure 30 is configured by a coil wire 31 that extends from a start point P1 to an end point P2. The coil wire 31 of the coil structure 30 extends in spiral along a circumferential direction around the one or more power wires 20. The coil structure 30 include a plurality of coil segments 40 each including one winding of the coil wire 31 or each corresponding to one winding of the coil wire 31. The plurality of coil segments 40 are arranged in a circumferential direction around the one or more power wires 20 between the start point P1 and the end point P2 of the coil wire 31. Note that, as would be understood from the following descriptions, the coil structure 30 may include a wire structure less than a coil segment 40 as defined below, i.e. semi-coil segment 40'.

Each coil segment 40 included in the coil structure 30 has a first conductor 51, a second conductor 52, a first connection wire 61, and a second connection wire 62. The first conductor 51 extends along the power wire 20, optionally substantially in parallel with the power wire 20. The second conductor 52 is positioned farther away from the one or more power wires 20 than the first conductor 51. The second conductor 52 extends along the power wire 20, optionally substantially in parallel with the power wire 20. The first connection wire 61 connects the first and second conductors 51, 52 in the same coil segment 40. The second connection wire 62 connects first and second conductors 51, 52 of adjacent coil segments 40 in the circumferential direction.

As shown in FIG. 2, the respective first conductors 51 are arranged to have the same distance from a circumferential contour of the power wire 20 in a plane orthogonal to a direction the power wire 20 extends. The first conductors 51 are arranged at the regular interval on a smaller-diameter imaginary circle indicated by a phantom line L1 centered around the power wire 20. The respective second conductors 52 are arranged to have the same distance from a circumferential contour of the power wire 20 in a plane orthogonal to a direction the power wire 20 extends. The second conductors 52 are arranged at the regular interval on a larger-diameter imaginary circle indicated by a phantom line L2 centered around the power wire 20. The smaller and larger-diameter imaginary circles are co-axially arranged.

The first conductor 51 has a first end at the first surface 18 side of the heat-resistant substrate 10 and a second end at the second surface 19 side. Likewise, the second conductor 52 has a first end at the first surface 18 side of the heat-resistant substrate 10 and a second end at the second surface 19 side. In some cases, each conductor is shaped like a cylinder that extends in parallel with the power wire 20. In one same coil segment 40, a direction of current instantaneously flowing in the first conductor 51 and a direction of current instantaneously flowing in the second conductor 52 are opposite. This facilitates to reduce a common mode noise in the induced current. Note that an alternating current may flow in the power wire 20 in some cases. High-frequency alternating current equal to or over 100A may flow in the power wire 20 in some cases.

The first connection wire 61 connects the first and second conductors 51, 52 in the same coil segments 40. The first connection wire 61 connects the second end of the first conductor 51 and the second end of the second conductor 52. The first connection wire 61 extends linearly from the second end of the first conductor 51 toward the second end of the second conductor 52 and radially outward with respect to the above-described imaginary circles.

The second connection wire 62 connects the first and second conductors 51, 52 of adjacent coil segments 40 in the circumferential direction. The second connection wire 62 couples a first end of the second conductor 52 belonging to a given coil segment 40 with a first end of the first conductor 51 belonging to a coil segment 40 that is arranged adjacent to the given coil segment 40 in the circumferential direction. The first connection wire 61 extends linearly from the first end of the second conductor 52 to the first end of the first conductor 51, radially inward relative to the above-described imaginary circles.

The number of coil segments 40 included in the coil structure 30 may be various and should not be limited to the illustrated example. Interval (angle) of second connection wires 62 of the coil segments 40 along the circumferential direction would be various, and should not be limited to the illustrated example. The same applies to the first connection wire 61. The axial length of the first conductor 51 is not required to be shorter than that of the power wire 20, and may be longer. The same applies to the second conductor 52. The power wire 20 is not required to be larger in diameter compared with the first and second conductors 51, 52. It is envisioned that the power wire 20 is divided into plural smaller-diameter power wires. Note that, the plural power wires with smaller-diameter are coupled at a common current-inputting terminal and likewise coupled at a common current-outputting terminal.

Optionally, the heat-resistant substrate 10 according to a non-limiting example shown in FIG. 1 further has a returning wire 70 that extends along the circumferential direction from the end point toward the start point of the coil wire of the coil structure and passes through the coil segments. The returning wire 70 is embedded in the heat-resistant substrate 10. Current flows in the returning wire 70 in a direction opposite to a direction current flows in the coil wire 31 of the coil structure 30, possibly reducing a common mode noise component. As in the modified example described below, an embodiment is envisioned where the returning wire 70 is omitted. The returning wire 70 extends through the coil segments 50 in the circumferential direction from the start point P3 to the end point P4. The returning wire 70 exists in a plane orthogonal to the power wire 20.

An external connection wire 82 is coupled to the end point P4 of the returning wire 70. The external connection wire 82 is built by a column 82j coupled to the end point P4 of the returning wire 70 and a linear portion 82k that is coupled to one end of the column 82j and extends on the first surface 18 of the heat-resistant substrate 10. Various manners would be envisioned as to ensuring electrical contact for the returning wire 70. It is envisioned that the linear portion 82k of the external connection wire 82 may be omitted, and a terminal of another electronic component may be connected via a bump to the column 82j of the external connection wire 82.

In a case where the coil structure 30 is not embedded in the heat-resistant substrate 10 consisting of a ceramic material as the main component, relative position between the coil structure 30 and the power wire 20 may be changed due to thermal expansion. In the present embodiment, the power wire 20 and the coil structure 30 are embedded in the heat-resistant substrate 10. The coil wire 31 of the coil structure 30 is not exposed from the heat-resistant substrate 10 or is partially exposed from the heat-resistant substrate 10. Thermal expansion of the coil structure 30 and the power wire 20 is suppressed by the ceramic material/ceramic portion of the heat-resistant substrate 10, and thus effectively lowering thermal influence to the position between the coil structure 30 and the power wire 20 and the position between the coil segment 40 and the power wire 20. As a result, accuracy of detecting a current would be improved.

In a case where the coil structure 30 is not embedded in the heat-resistant substrate 10 consisting of a ceramic material as the main component, an area surrounded by the coil structure 30 may possibly be changed due to thermal expansion. In other words, in a cross-section orthogonal to the direction the power wire 20 extends, an area surrounded by the plural first conductors 51 may possibly be changed. In the present embodiment, the first conductor 51, the second conductor 52, the first connection wire 61, and the second connection wire 62 of the coil segment 40 are embedded in the heat-resistant substrate 10. The first conductor 51 and the second conductor 52 of the coil segment 40 is not exposed from the heat-resistant substrate 10. The first connection wire 61 and the second connection wire 62 of the coil segment 40 are not exposed from the heat-resistant substrate 10 or at least partially exposed from the heat-resistant substrate 10 in the first surface 18 or the second surface 19 of the heat-resistant substrate 10. It is avoided or suppressed that the coil structure 30 or the coil segment 40, which are more susceptible to thermal influence than the heat-resistant substrate 10, are exposed from the heat-resistant substrate 10, thus effectively lowering a thermal influence to the geometry of the coil structure 30 or the coil segment 40. As a result, accuracy of detecting a current would be improved.

An external connection wire 81 for flowing a current through the coil structure 30 may be provided in various manners. For example, at least one external connection wire 81 is connected to the first conductor 51, the second conductor 52, the first connection wire 61, or the second connection wire 62 of the coil segment 40. In the example of FIG. 1, the external connection wire 81 is built by a column 81j which is disposed as an extended portion from the first conductor 51 of the coil segment 40, and a linear portion 81k that is coupled to one end of the column 81j and extends on the first surface 18 of the heat-resistant substrate 10. It is envisioned that the linear portion 81k of the external connection wire 81 is omitted, and a terminal of another electronic component is connected via a bump to the column 81j of the external connection wire 81.

As stated at the beginning, the coil structure 30 may include a wire structure less than a coil segment 40 as defined above, i.e. semi-coil segment 40'. For example, if the external connection wire 81 is connected to the first conductor 51 of the coil segment 40, then the combination of the first connection wire 61, the second conductor 52, and the second connection wire 62 of the coil segment 40 may be omitted. If the external connection wire 81 is connected to the first connection wire 61 of the coil segment 40, then the combination of the second conductor 52 and the second connection wire 62 of the coil segment 40 may be omitted. If the external connection wire 81 is connected to the second conductor 52 of the coil segment 40, then the second connection wire 62 may be omitted. A coil segment 40 that does not have all of the first conductor 51, the first connection wire 61, the second conductor 52, and the second connection wire 62 is named as a semi-coil segment 40'. In some cases, the coil structure 30 includes a plurality of semi-coil segments 40'.

Figure 3:
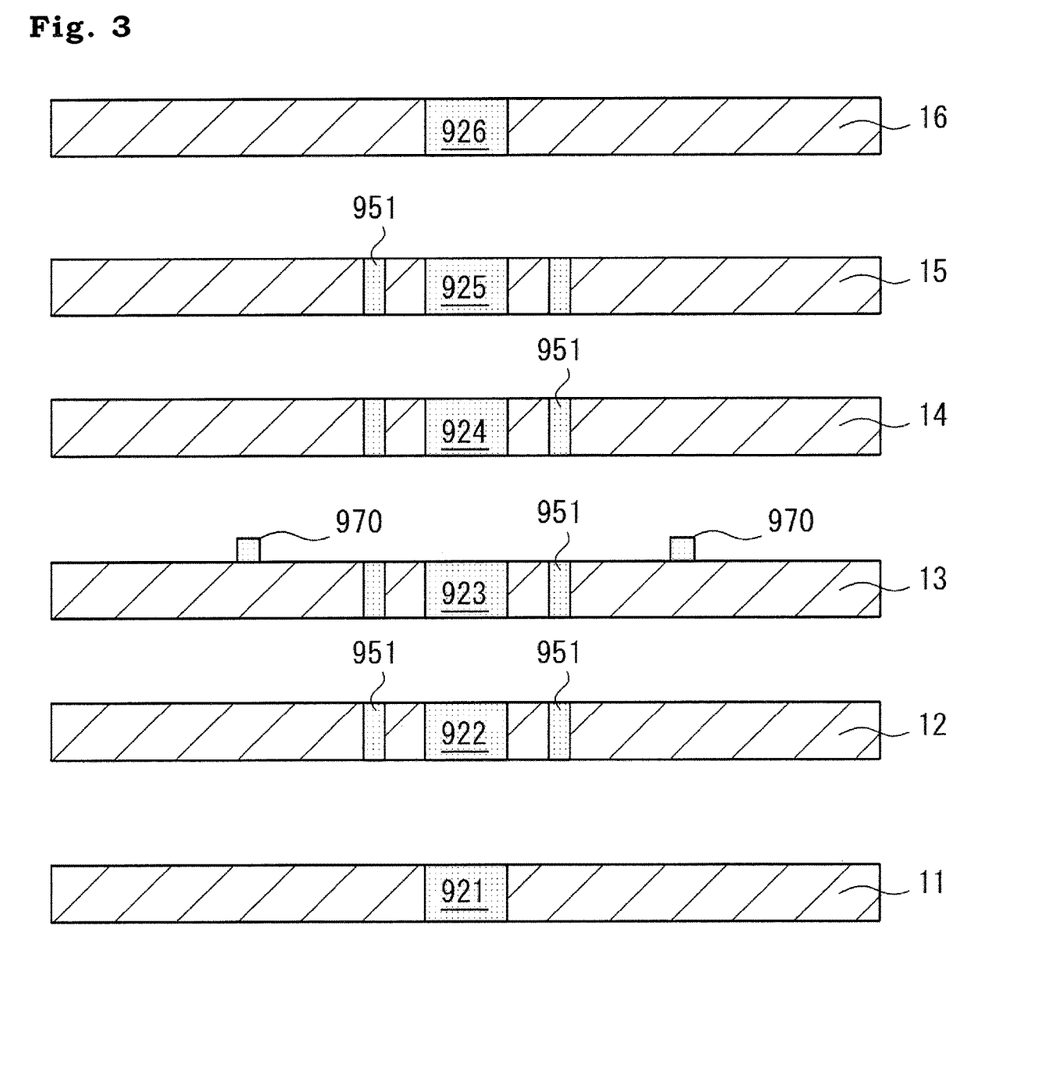
FIG. 3 is a schematic view describing a non-limiting exemplary process of producing a heat-resistance element shown in FIG. 1, corresponding to schematic cross-sectional view taken along a line III-III in FIG. 2.
Figure 4:
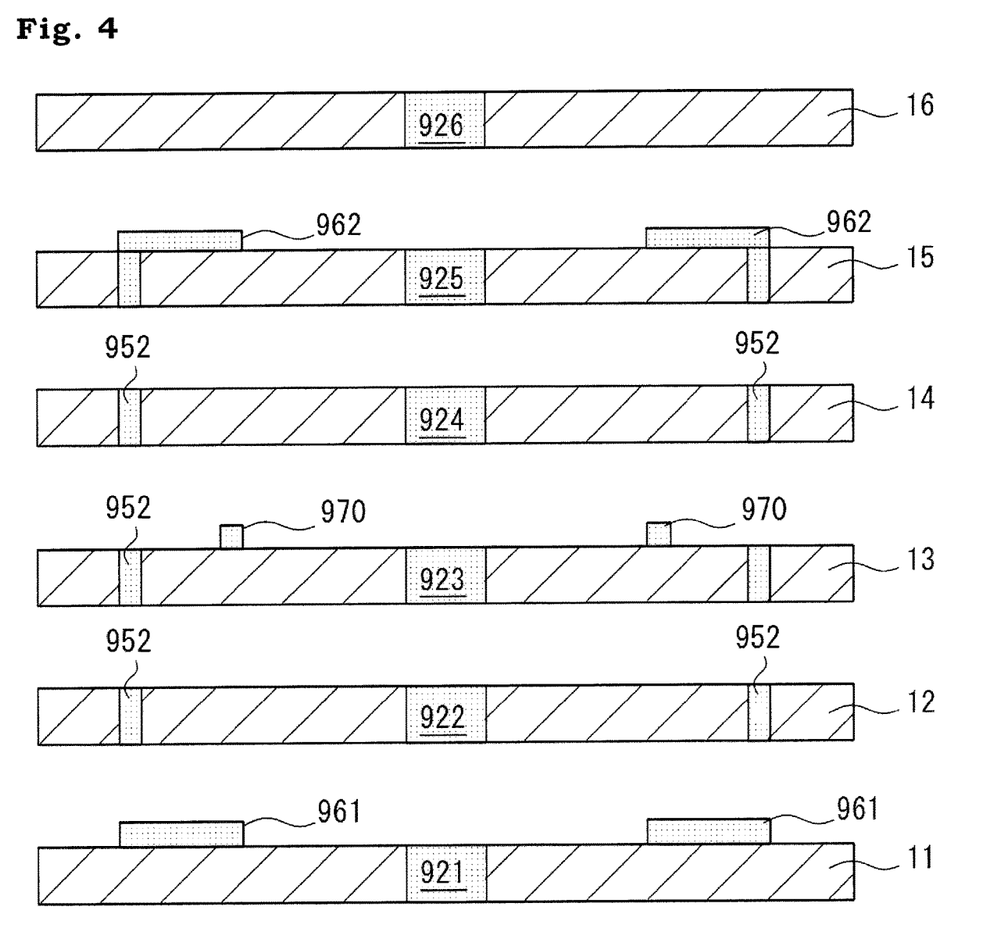
FIG. 4 is a schematic view describing a non-limiting exemplary process of producing a heat-resistance element shown in FIG. 1, corresponding to schematic cross-sectional view taken along a line IV-IV in FIG. 2.
Figure 5:
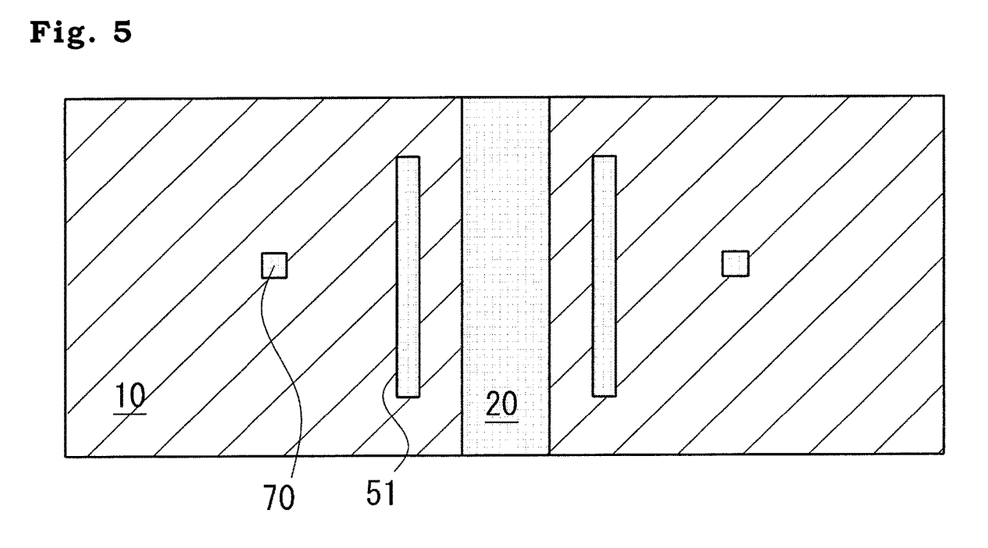
FIG. 5 is a schematic view illustrating a stack of green sheets (unfired ceramic sheets) shown in FIG. 3 and its fired configuration.
Figure 6:
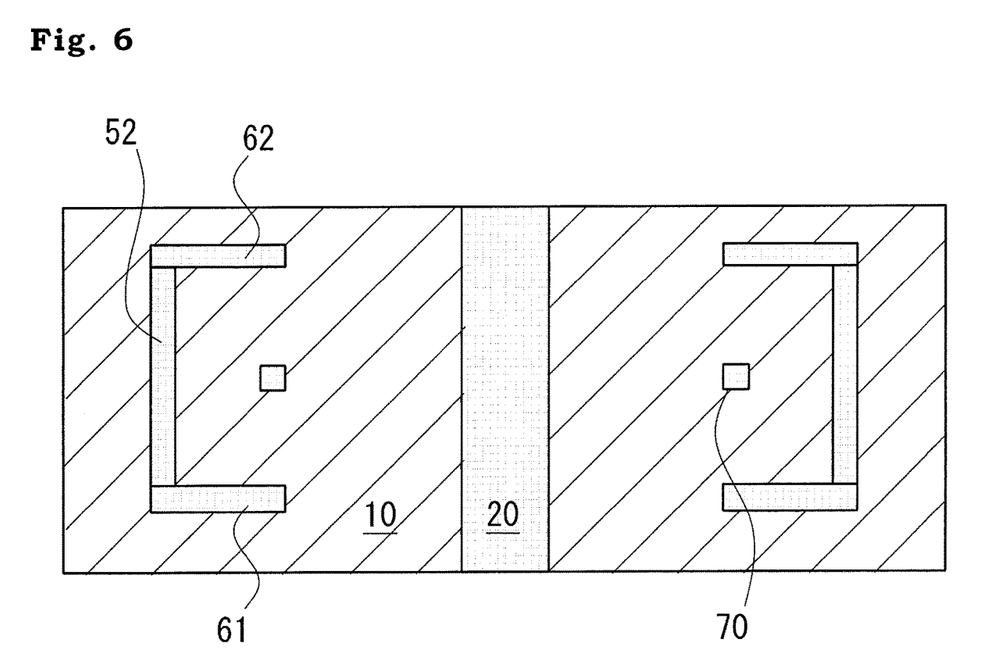
FIG. 6 is a schematic view illustrating a stack of green sheets shown in FIG. 4 and its fired configuration.

The heat-resistance element 1 shown in FIGS. 1 and 2 can be produced through various methods. FIGS. 3-6 schematically shows a non-limiting exemplary method of producing a heat-resistance element 1. FIG. 3 is a schematic view describing a non-limiting exemplary process of producing a heat-resistance element, corresponding to schematic cross-sectional view taken along a line III-III in FIG. 2. FIG. 4 is a schematic view describing a non-limiting exemplary process of producing a heat-resistance element, corresponding to schematic cross-sectional view taken along a line IV-IV in FIG. 2. FIG. 5 is a schematic view of a stack of green sheets shown in FIG. 3 and its fired configuration. FIG. 6 is a schematic view illustrating a stack of green sheets shown in FIG. 4 and its fired configuration.

As an overview, the green sheets 11-16 shown in FIGS. 3 and 4 are prepared, and then stacked and fired.

Each green sheet 11-16 includes ceramic powder (e.g. alumina powder), glass powder, binder power (e.g. PVB (polyvinyl butyral)), and solvent (e.g. butanol or ethanol). Organic component (binder power and solvent) included in the green sheet 11-16 is removed through firing, so that a fired body of mixture of ceramic and glass is obtained.

The respective green sheets 11-16 are configured to build, after being stacked and fired, the coil structure 30 and the returning wire 70 and the like shown in FIGS. 1 and 2. For example, in each green sheet 11-16, hole(s) is/are formed at appropriate location and filled by conductive paste. A conductive paste is formed as a layer on the sheet surface of each green sheet 11-16 such that a desired pattern is formed. That is, a pattern of conductive paste is formed on the sheet surface of each green sheet 11-16. While the green sheets 11-16 are fired, organic component in the conductive paste is removed, and metal particles in the conductive paste are bonded to form a portion of the power wire 20 or the coil structure 30 or the like.

The conductive paste includes, as a conductive member included in the conductive paste, a group of metal particles to be included in the power wire 20 and/or the coil structure 30. In some cases, the metal particle included in the conductive paste includes copper or silver as the main component or includes an alloy that includes copper or silver as the main component. The conductive paste may include organic binder and/or solvent additionally to the metal particles such as copper or silver. Use of printing technique allows efficient and precise formation of pattern of conductive paste onto the sheet surface of the green sheet. Note that, various methods such as punching, cutting, laser ablation or the like may be employed to form holes in the green sheets 11-16.

A non-limiting exemplary method of producing a heat-resistance element 1 may include the following steps.

The 1st step may include mixing ceramic power (e.g. alumina power) and a glass power. Any types of mixer may be used.

The 2nd step may include mixing, in a sink, the mixture of ceramic and glass powers obtained by the first step, binder power and solvent to obtain a slurry. Rotation of impeller in a sink facilitates sufficient mixing of material.

The 3rd step may include molding a sheet with a predetermined thickness from the slurry, and then heating and drying to obtain a green sheet.

The 4th step may include cutting the green sheet into pieces of the predetermined size.

The 5th step may include forming a predetermined hole in the green sheet of the predetermined size.

The 6th step may include filling the hole in the green sheet with a conductive paste, and forming a layer of conductive paste onto the sheet surface of the green sheet. In some cases, the conductive paste is printed onto the sheet surface of the green sheet. Screen printing and the like can be named as printing.

The 7th step may include stacking green sheets each having a hole filled with conductive paste and/or having a sheet surface on which a pattern of conductive paste is formed. If required, the stack of green sheets is pressed in the stacking direction so that a stack of green sheets closely adhered in the stacking direction would be obtained.

The 8th step may include debindering and firing the stack of green sheets in a non-oxidizing atmosphere.

In some cases, the green sheet 11 is a LTCC (Low Temperature Co-fired Ceramics) sheet. In other words, the green sheet 11 includes both of one or more ceramic material and glass material, the one or more ceramic material being selected from a group consisting of: alumina ($Al_2O_3$), silica ($SiO_2$), zirconia ($ZrO_2$), titania ($TiO_2$), magnesia (MgO) and cordierite ($2MgO\text{-}2Al_2O_3\text{-}5SiO_2$). In an example, the green sheet 11 includes alumina and glass material. The benefit of the combination of these materials is as described above.

In some cases including the illustrated example, a first unfired portion 921 is embedded in the green sheet 11, and a first unfired connection wire 961 is formed on the top surface of the green sheet 11. In an example, the first unfired portion 921 is made of the conductive paste described above, and will be the first portion of the power wire 20 after being fired. Likewise, the first unfired connection wire 961 is made of the conductive paste described above, and will be the first connection wire 61 after being fired. The first unfired connection wire 961 may be embedded in the green sheet 11 such that the top surface of the first unfired connection wire 961 and the top surface of the green sheet 11 are flush one another.

A second unfired portion 922 and unfired portions 951, 952 which will be portions of the first and second conductors 51, 52 of the coil segment 40 are embedded in the green sheet 12. In an example, the second unfired portion 922 is made of the conductive paste described above, and will be the second portion of the power wire 20 after being fired. Likewise, the unfired portion 951 is made of the conductive paste described above, and will be a portion of the first conductor 51 after being fired. Likewise, the unfired portion 952 is made of the conductive paste described above, and will be a portion of the second conductor 52 after being fired.

A third unfired portion 923 to be the third portion 23 of the power wire 20 and unfired portions 951,952 to be portions of the first and second conductors 51, 52 of the coil segment 40 are embedded in the green sheet 13. An unfired returning wire 970, which will be the returning wire 70, is formed on the top surface of the green sheet 13. A fourth unfired portion 924, which will be the fourth portion 24 of the power wire 20, and unfired portions 951, 952, which will be portions of the first and second conductors 51, 52 of the coil segment 40 are embedded in the green sheet 14. A fifth unfired portion 925, which will be a fifth portion 25 of the power wire 20, and unfired portions 951, 952, which will be portions of the first and second conductors 51, 52 of the coil segment 40 are embedded in the green sheet 15. The top surface of the green sheet 15 is provided with a second unfired connection wire 962 which will be the second connection wire 62. A sixth unfired portion 926 is embedded in the green sheet 16 which will be the sixth portion 26 of the power wire 20. In an example, similar to above, the third to sixth unfired portions 923-926 of the power wire 20 are made of the conductive paste described above. Likewise, the second unfired connection wire 962 and the unfired portions 951, 952 which will be portions of the first and second conductors 51, 52 are made of the conductive paste described above, in an example.

Such green sheets 11-16 are fired while being stacked so that green sheets adjacent in the stacking direction will be sintered together. In particular, ceramic material of the green sheets adjacent in the stacking direction will be sintered together; the unfired portions will be sintered together to form the power wire 20; the unfired portions will be sintered together to form the first conductor 51; and the unfired portions will be sintered together to form the second conductor 52. Sintered coupling of the first conductor 51 and the first connection wire 61, sintered coupling of the first conductor 51 and the second connection wire 62, sintered coupling of the second conductor 52 and the first connection wire 61, and sintered coupling of the second conductor 52 and the second connection wire 62 will be also caused. Sintered coupling of the end point P2 of the coil structure 30 and the returning wire 70 will also be caused. If required, sintered coupling of the coil structure 30 and the external connection wire 81 or sintered coupling of the returning wire 70 and the external connection wire 82 will also be caused.

Another example is envisioned where a power wire 20 produced by processing of metal wire and a coupled body of coil structure 30 and returning wire 70 produced from processing of metal wire are embedded in ceramic powder and this is fired to produce a heat-resistance element 1. In a case where the returning wire 70 is omitted, configuration of metal structure to be embedded in ceramic powder will be simplified. Use of three-dimensional printer will allow precisely configured geometry of metal structure to be embedded in ceramic powder.

Figure 7:
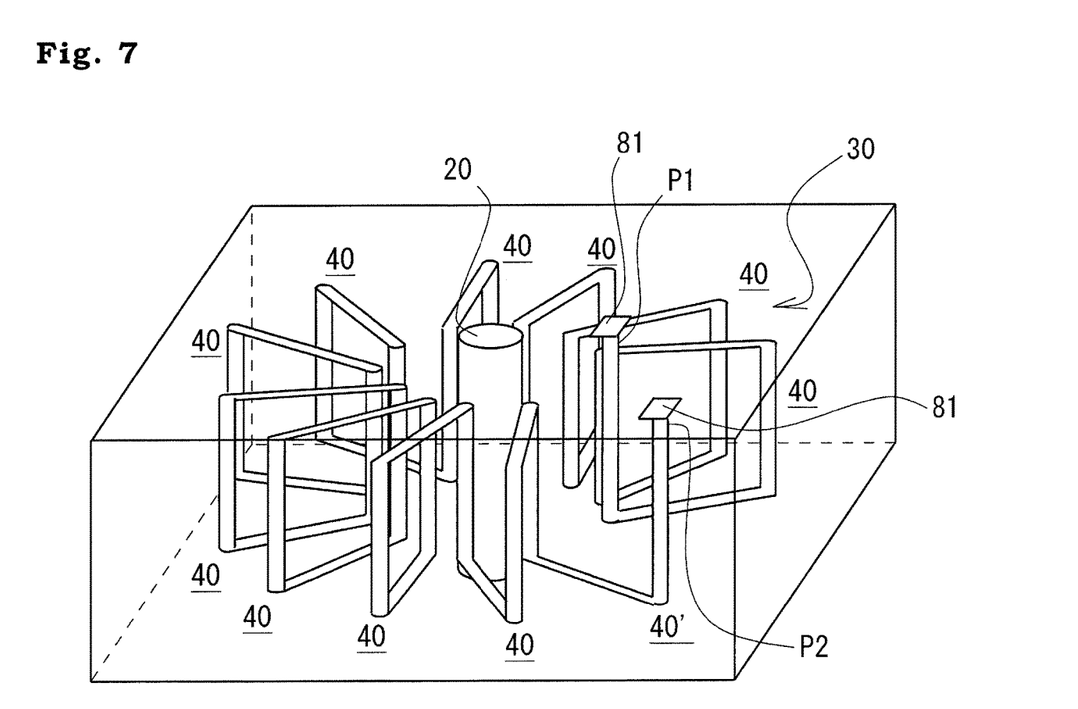
FIG. 7 is a schematic perspective view of a heat-resistance element according to another aspect of the present disclosure, illustrating power wires, coil structure and the like embedded in a heat-resistant substrate.

0001 FIG. 7 is a schematic perspective view of a heat-resistance element according to another aspect of the present disclosure, illustrating power wires, coil structure and the like embedded in a heat-resistant substrate. FIG. 7 is a view mainly for a clear illustration of configurations of the power wires and the coil structure. In this embodiment either, the coil structure 30 is embedded in the heat-resistant substrate 10, similar to the above-described embodiment or example. Therefore, the same technical effect would be obtained as in the above-described embodiment or example.

In a case shown in FIG. 7, the returning wire 70 is omitted. As described in the above-described embodiment or example, in the same coil segment 40, a direction of current instantaneously flowing in the first conductor 51 and a direction of current instantaneously flowing in the second conductor 52 are opposite, thereby facilitating reduction of common mode noise in the induced current.

Figure 8:
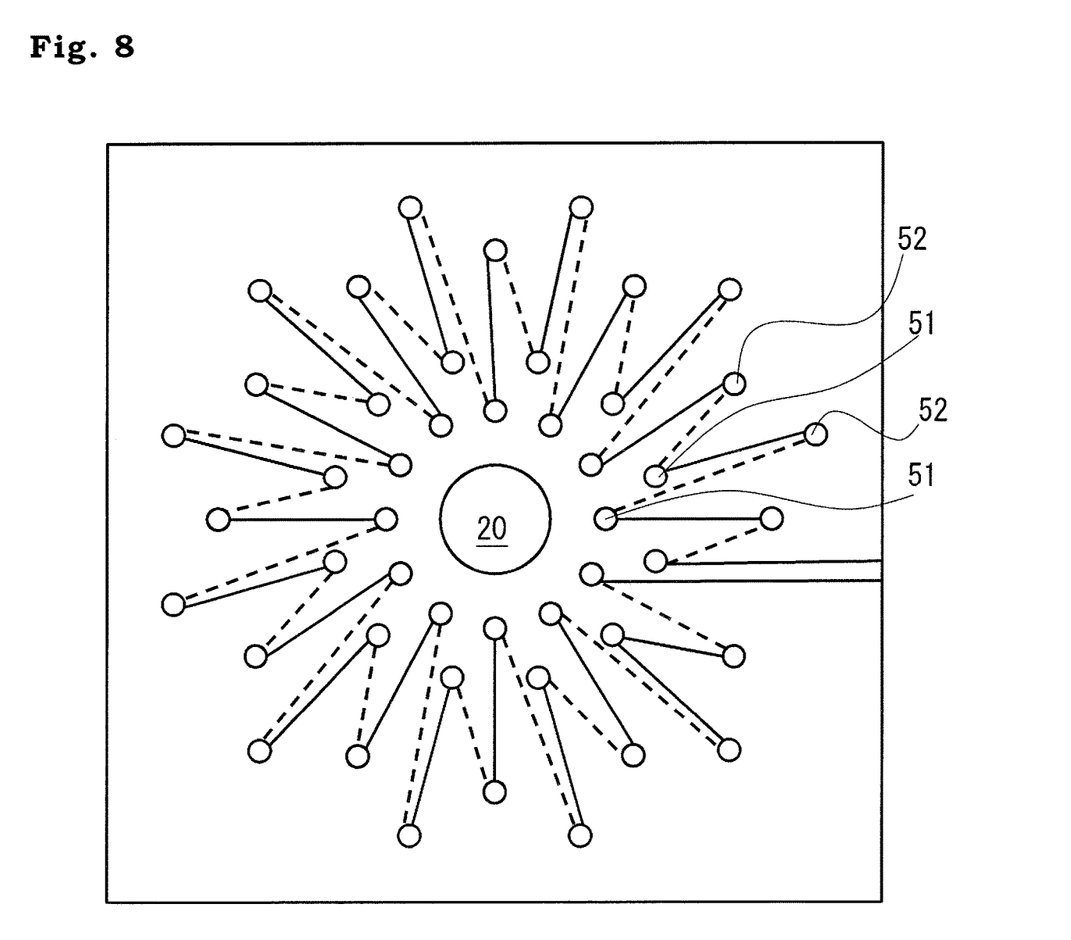
FIG. 8 is schematic top view of a heat-resistance element and illustrates a first variation of a coil structure embedded in the heat-resistant substrate. The first and second conductors are schematically illustrated by circles respectively.

FIG. 8 is schematic top view of a heat-resistance element and illustrates a first variation of a coil structure embedded in the heat-resistant substrate. In the variation example of FIG. 8, the first conductors 51 are arranged in zigzag along the circumferential direction. Likewise, the second conductors 52 are arranged in zigzag along the circumferential direction. In other words, distance between the first conductor 51 and the power wire 20 fluctuates between first and second distances along the circumferential direction. The second distance is greater than the first distance. Likewise, distance between the second conductor 52 and the power wire 20 fluctuates between third and fourth distances along the circumferential direction. The fourth distance is greater than the third distance. In such a case, the greater number of first conductors 51 may be more closely arranged to the power wires 20, facilitating increased current detection ability.

Figure 9:
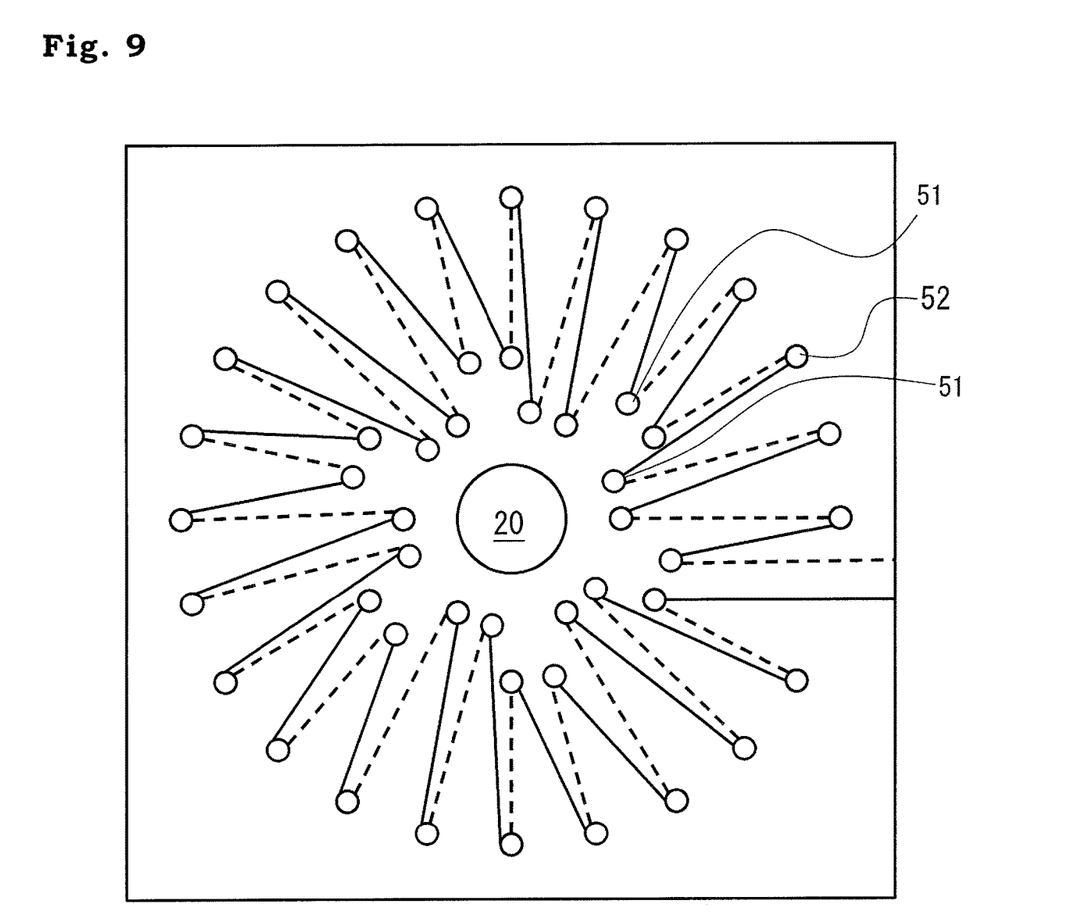
FIG. 9 is a schematic top view of a heat-resistance element and illustrates a second variation of a coil structure embedded in the heat-resistant substrate. The first and second conductors are schematically illustrated by circles respectively.

FIG. 9 is a schematic top view of a heat-resistance element and illustrates a second variation of a coil structure embedded in the heat-resistant substrate. In the variation example of FIG. 9, pairs of first conductors comprised of two first conductors arranged adjacent in the circumferential direction are arranged in zigzag along the circumferential direction. FIG. 9 also indicates further variation example in which subunits of first conductors comprised of two or more first conductors 51 arranged adjacent in the circumferential direction are arranged in zigzag along the circumferential direction. This facilitates that the larger number of first conductors 51 are more closely arranged to the power wires 20.

Figure 10:
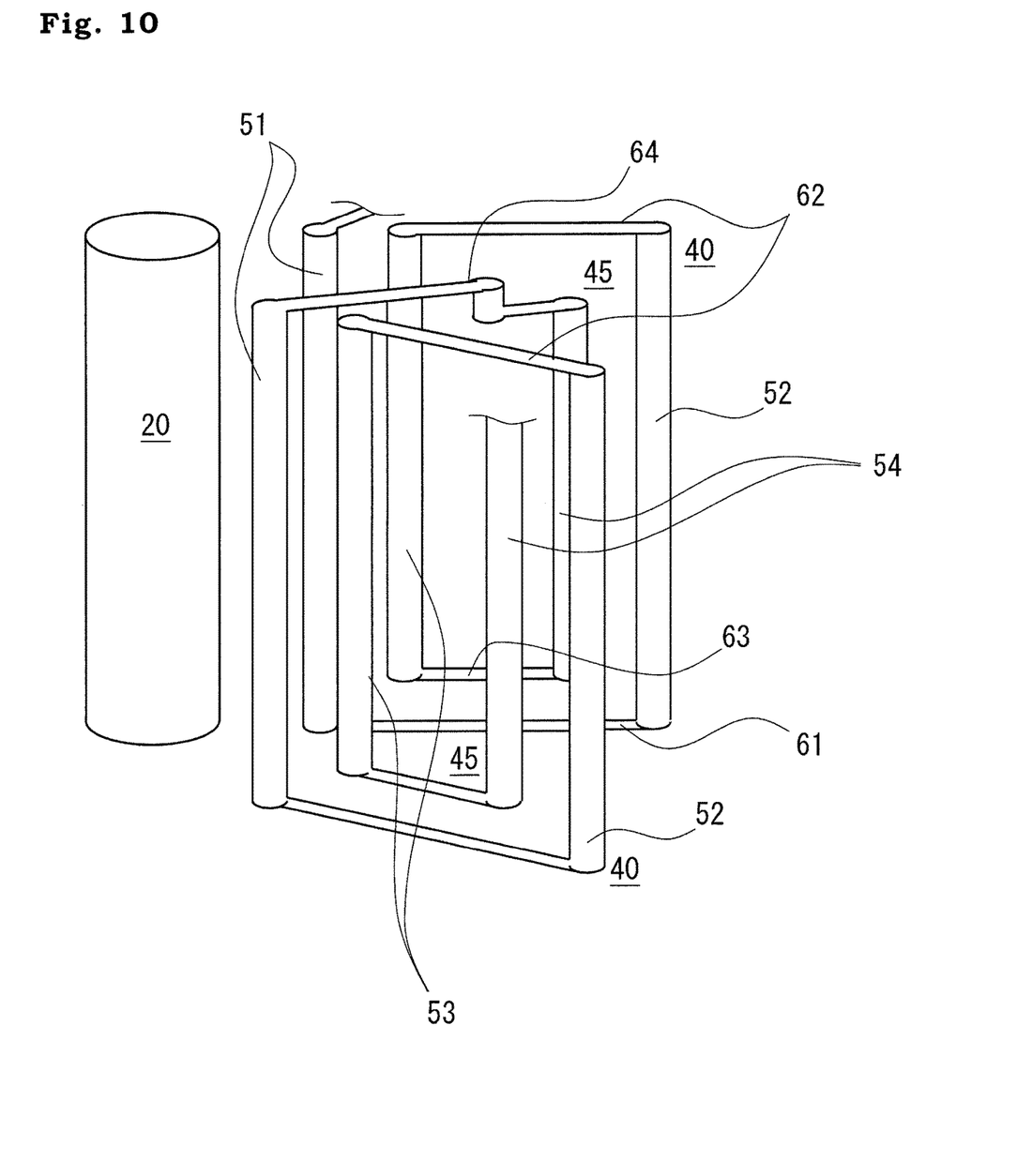
FIG. 10 is a schematic view partially illustrating a power wire and a coil structure included in a heat-resistance element, showing an example where adjacent coil segments in a circumferential direction around a power wire are coupled via a relay coil segment.

FIG. 10 is a schematic view partially illustrating a power wire and a coil structure included in a heat-resistance element, showing an example where adjacent coil segments in a circumferential direction around a power wire are coupled via a relay coil segment. In the variation example shown in FIG. 10, the adjacent coil segment 40 in the circumferential direction are coupled via at least one relay coil segment 45 sized smaller than the coil segment 40. The second connection wire 62 of the coil segment 40 connects the first or second conductor 51, 52 with the relay coil segment 45, instead of connecting the first and second conductors 51, 52 between adjacent coil segments 40 in the circumferential direction. Addition of the relay coil segments 45 facilitates high-density arrangement of coil segments in the coil structure 30, facilitating improved detecting ability of current.

The relay coil segment 45 includes: a third conductor 53 extending along the power wire 20; a fourth conductor 54 arranged farther from the one or more power wires 20 than the third conductor 53, the fourth conductor 54 extending along the power wire 20; a third connection wire 63 coupling the third and fourth conductors 53, 54; a fourth connection wire 64 coupling the third or fourth conductor 53, 54 with the first or second conductor 51, 52. The third and fourth conductors 53, 54 extend substantially in parallel along the power wire 20.

In the illustrated example of FIG. 10, the fourth connection wire 64 connects the fourth conductor 54 and the first conductor 51. In the illustrated example of FIG. 10, the first to fourth conductors 51-54 exist in the same plane. This plane is a plane that extends in parallel with the power wire 20, and in the power wire 20 exists in that plane.

A further variation is envisioned in which adjacent coil segments 40 in the circumferential direction are coupled via two or more relay coil segments.

Figure 11:
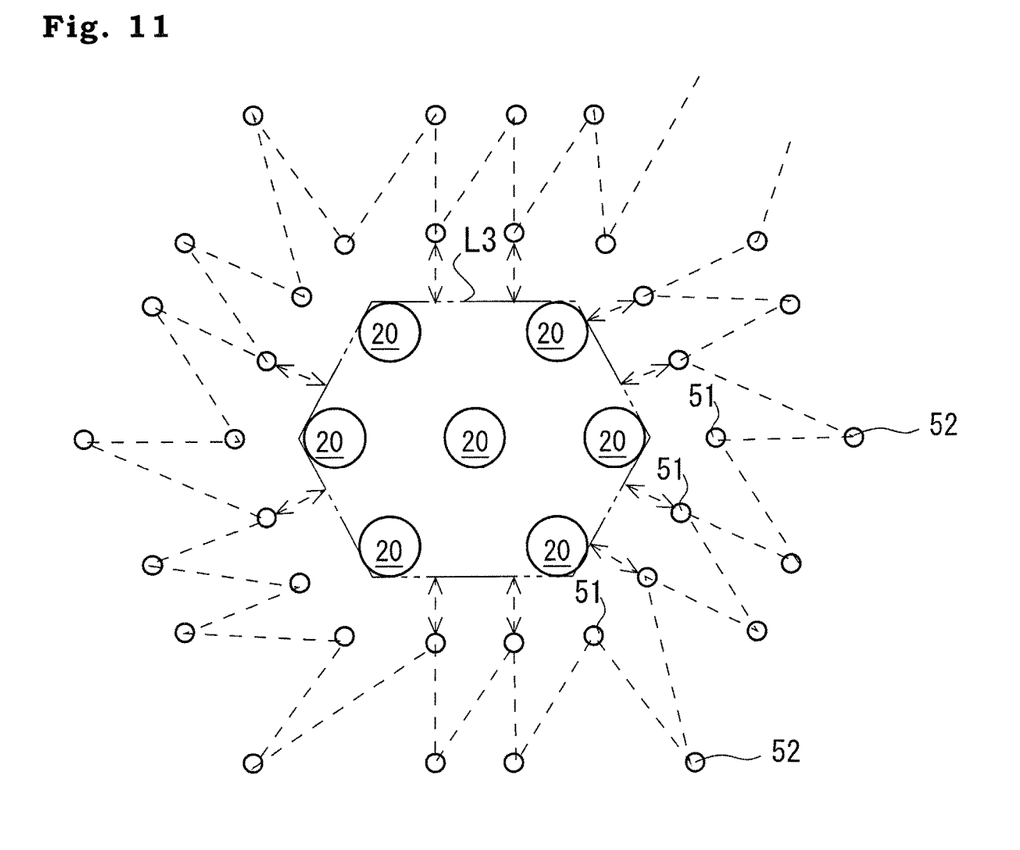
FIG. 11 is a schematic partial top view of a heat-resistance element, showing a variation where a plurality of power wires is disposed.

FIG. 11 is a schematic partial top view of a heat-resistance element, showing a variation where a plurality of power wires is disposed. As shown in FIG. 11, the respective first conductors 51 are arranged to have the same distance from a circumferential line L3 surrounding the plurality of power wires 20 in a plane orthogonal to a direction the power wire 20 extends. In other words, the respective first conductors 51 are arranged to have the minimum distance from the circumferential line L3, surrounding the group of power wires 20 comprised of three or more power wires 20, in a plane orthogonal to a direction the group of power wires extend. In a case where a high frequency current flows in the power wire 20, a skin effect is caused, i.e. a phenomenon is caused such that larger amount of high frequency current flows nearby the wire surface of the power wire 20. In a case where a power wire 20 is not a single thick wire and comprises a plurality of narrower wires, the surface area of the total of the power wires 20 would be larger, thus reducing the resistance of power wires 20 with respect to the high frequency current.

The circumferential line L3 is made of a series of tangential lines in the circumferential direction which touch the circumferences of the power wires 20 adjacently arranged in the circumferential direction. In the case of FIG. 11, the circumferential line L3 is made of a series of total 6 tangential lines in the circumferential direction which touch the circumferences of the power wires 20 adjacently arranged in the circumferential direction. In the case of FIG. 11, the circumferential line L3 is shaped like a hexagon, but may be a polygon such as a triangle, pentagon, hexagon, octagon, nonagon and the like.

In accordance with arrangement of the first conductors 51 relative to the geometry of the circumferential line L3, the cross-sectional shape of the first conductor 51, the manner of arrangement of the first conductors 51 relative to the circumferential line L3 and/or production yield, the distance or the minimum distance between the circumferential line L3 and the first conductor 51 may fluctuate within a given range. For example, this range may be defined by at least one of $0.7 < (dmin/dmax)$, $0.75 < (dmin/dmax)$, $0.8 < (dmin/dmax)$, 0.85<(dmin/ dmax), 0.9<(dmin/ dmax) and 0.95<(dmin/ dmax), where the maximum value "dmax" indicates the maximum distance "d" between the circumferential line L3 and the first conductor 51, and the minimum value "dmin" indicates the minimum distance "d" between the circumferential line L3 and the first conductor 51. It is intended that the equal amount of distance or minimum distance should be construed to include the above-described variation, and should not be limited to a case where they are precisely or perfectly equal.

Figure 12:
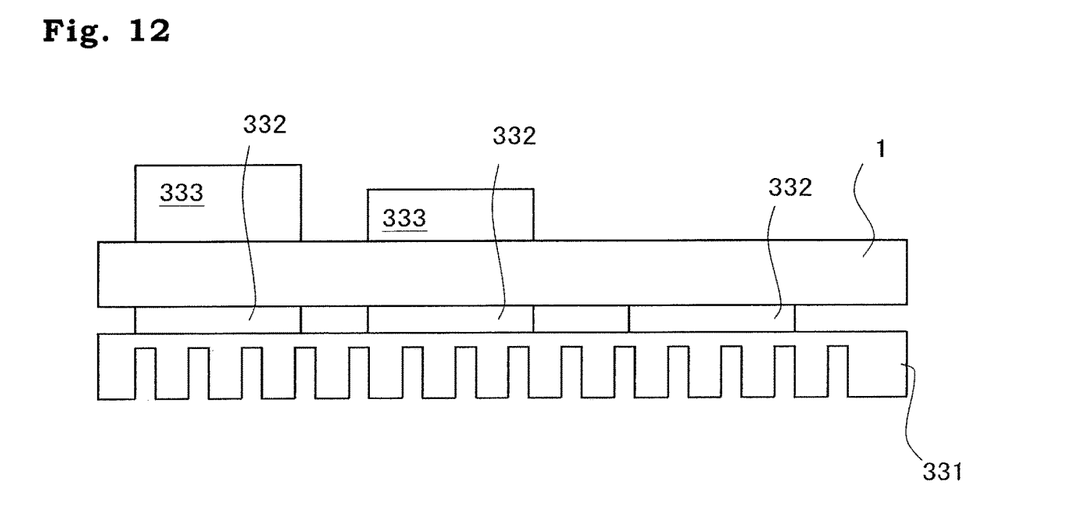
FIG. 12 is a view showing an example of assembly into which a heat-resistance element is incorporated.

FIG. 12 is a view showing an example of assembly into which a heat-resistance element is incorporated. As shown in FIG. 12, the heat-resistant substrate 10 of the heat-resistance element 1 is used as a circuit board onto which a plurality of electronic components is mounted. A plurality of first electronic components 332 is mounted onto the bottom surface of the heat-resistant substrate 10. A plurality of second electronic components 333 is mounted onto the top surface of the heat-resistant substrate 10. The first electronic components 332 may be active elements such as SiC-based MOSFET and the like. The second electronic components 333 may be passive elements such as capacitors and the resistors.

Each first electronic component 332 is coupled with the heat-sink 331, i.e. mounted onto the heat-sink 331. Heat caused by the operation of the first electronic components 332 is transmitted to the heat-sink 331, and excess heating of the first electronic components 332 is suppressed. The heat-sink 331 may be air-cooled as one example. The assembly shown in FIG. 12 does not include a highly active cooling device. This is a result of increased heat-resistance of each component in the assembly.

Based on the above teaching, a skilled person in the art would be able to add various modifications to the respective embodiments. Reference numerals in Claims are just for reference and should not be referred for the purpose of narrowly construing the scope of claims.

The invention claimed is:

1. A heat-resistance element for detecting a current, the heat-resistance element comprising:
    a heat-resistant substrate including a ceramic material;
    one or more power wires embedded in the heat-resistant substrate; and
    a coil structure for detecting a current flowing in the one or more power wires, the coil structure being configured by a coil wire extending between start and end points, the coil structure comprising coil segments arranged between the start and end points of the coil wire in a circumferential direction around the one or more power wires, and the coil segment including or corresponding to one winding of the coil wire, wherein the coil segment includes:
    a first conductor extending along the power wire;
    a second conductor arranged farther from the one or more power wires than the first conductor, the second conductor extending along the power wire;
    a first connection wire coupling the first and second conductors in the same coil segment; and
    a second connection wire electrically coupling first and second conductors of adjacent coil segments in the circumferential direction, and wherein
    the first conductor, the second conductor, the first connection wire, and the second connection wire are embedded in the heat-resistant substrate, and at least the first conductor and the second conductor are not exposed from the heat-resistant substrate,
    wherein adjacent coil segments in the circumferential direction are coupled through at least one relay coil segment that is sized smaller than the coil segment, and at least one second connection wire of an adjacent coil segment couples one of the first or second conductor with the relay coil segment,
    wherein the relay coil segment includes:
    a third conductor extending along the power wire;
    a fourth conductor arranged farther from the one or more power wires than the third conductor, the fourth conductor extending along the power wire;
    a third connection wire coupling the third and fourth conductors in the same relay coil segment; and
    a fourth connection wire coupling the third or fourth conductor with the first or second conductor, and
    wherein the first to fourth conductors are arranged in the same plane.

2. The heat-resistance element of claim 1, further comprising at least one external connection wire coupled to the first conductor, the second conductor, the first connection wire, or the second connection wire.

3. The heat-resistance element of claim 1, wherein the ceramic material includes alumina, silica, zirconia, titania, magnesia, or cordierite.

4. The heat-resistance element of claim 1, wherein the heat-resistant substrate includes a glass material.

5. The heat-resistance element of claim 1, wherein the power wire and the coil structure include a same metal material.

6. The heat-resistance element of claim 1, wherein the power wire and the coil structure include copper.

7. The heat-resistance element of claim 1 in which the one or more power wires include a plurality of power wires, wherein respective first conductors are arranged by the same distance away from a surrounding line around the plurality of power wires in a plane orthogonal to a direction the power wires extend.

8. The heat-resistance element of claim 1, further comprising a returning wire extending along the circumferential direction from the end point toward the start point of the coil wire of the coil structure, the returning wire passing through the coil segments.

* * * * *